United States Patent
Park et al.

(10) Patent No.: US 8,952,314 B2
(45) Date of Patent: Feb. 10, 2015

(54) TWO-STEP ANALOG-DIGITAL CONVERTING CIRCUIT AND METHOD

(75) Inventors: Yu Jin Park, Seoul (KR); Kwi Sung Yoo, Seoul (KR); Seung Hyun Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 328 days.

(21) Appl. No.: 13/616,205

(22) Filed: Sep. 14, 2012

(65) Prior Publication Data
US 2013/0099090 A1    Apr. 25, 2013

(30) Foreign Application Priority Data
Oct. 19, 2011 (KR) .......................... 10-2011-0107061

(51) Int. Cl.
| | | |
|---|---|---|
| *H01L 27/00* | (2006.01) | |
| *H03M 1/16* | (2006.01) | |
| *H03M 1/12* | (2006.01) | |
| *H03M 1/56* | (2006.01) | |
| *H04N 5/374* | (2011.01) | |
| *H04N 5/378* | (2011.01) | |

(52) U.S. Cl.
CPC ................ *H03M 1/16* (2013.01); *H03M 1/123* (2013.01); *H03M 1/56* (2013.01); *H04N 5/374* (2013.01); *H04N 5/3742* (2013.01); *H04N 5/378* (2013.01)
USPC ................. 250/208.1; 250/214.1; 250/214 C; 341/126

(58) Field of Classification Search
CPC ............. H03M 2201/4185; H03M 2201/2185; H03M 2201/8192; H03M 1/00; G02F 7/00; H04N 5/378
USPC ...... 250/208.1, 214.1, 214 R, 214 DC, 214 C; 257/431; 341/126, 110; 710/69
See application file for complete search history.

(56) References Cited

U.S. PATENT DOCUMENTS

| | | | |
|---|---|---|---|
| 7,554,478 B2 | 6/2009 | Lim | |
| 7,924,207 B2 | 4/2011 | Snoeij et al. | |
| 2010/0265114 A1* | 10/2010 | Lee et al. ...................... | 341/155 |
| 2011/0080512 A1 | 4/2011 | Ay | |
| 2013/0120622 A1* | 5/2013 | Hiraoka et al. ............... | 348/294 |
| 2013/0341489 A1* | 12/2013 | Yoshida ..................... | 250/208.1 |

FOREIGN PATENT DOCUMENTS

| | | |
|---|---|---|
| JP | 2010-109893 | 5/2010 |
| KR | 1020080071035 A | 8/2008 |

* cited by examiner

*Primary Examiner* — Francis M Legasse, Jr.
(74) *Attorney, Agent, or Firm* — Volentine & Whitt, PLLC

(57) ABSTRACT

A two-step analog-digital converting circuit includes a comparator, an upper bit counter and a pulse residue conversion unit. The comparator is configured to compare a ramp signal and an input signal, and to output a resulting comparative signal. The upper bit counter is configured to receive the comparative signal and a clock signal, and to output upper bit values corresponding to a first time interval between a generation time point of the ramp signal and a first edge of the clock signal, the first edge of the clock signal immediately preceding a state transition time point of the comparative signal. The pulse residue conversion unit is configured to receive the comparative signal and the clock signal, and to output lower bit values corresponding to a second time interval between the first edge of the clock signal and the state transition time point of the comparative signal.

20 Claims, 12 Drawing Sheets

US 8,952,314 B2

TWO-STEP ANALOG-DIGITAL CONVERTING CIRCUIT AND METHOD

CROSS-REFERENCE TO RELATED APPLICATIONS

A claim of priority under 35 U.S.C. §119 is made to Korean Patent Application No. 10-2011-0107061, filed on Oct. 19, 2011, in the Korean Intellectual Property Office, the entire contents of which are hereby incorporated by reference.

BACKGROUND

Embodiments of inventive concept relate to an analog-digital converting scheme, and more particularly, to a two-step analog-digital converting circuit, operating method thereof, and devices including the same.

An image sensor captures images using light reaction characteristics of a semiconductor. A complementary metal-oxide semiconductor (CMOS) image sensor, in particular, consumes less power than a charge coupled device (CCD) image sensor, and is widely used in portable phones, digital cameras, and the like, in accordance with development of CMOS technology.

The CMOS image sensor includes an analog-digital converter (ADC) for processing a pixel signal output from a pixel. The ADC used herein is a single slope ADC. The single-slope ADC converts a pixel signal into a digital signal using a counter. Therefore, the higher the bit resolution, the more power is consumed by the single-slope ADC. A count clock signal, which has a higher frequency, is required to increase converting operation speed of the single-slope ADC, thus increasing power consumption of the single-slope ADC.

SUMMARY

According to an illustrative embodiment, a two-step analog-digital converting circuit includes a comparator, an upper bit counter and a pulse residue conversion unit. The comparator is configured to compare a ramp signal and an input signal, and to output a resulting comparative signal. The upper bit counter is configured to receive the comparative signal and a clock signal, and to output upper bit values corresponding to a first time interval between a generation time point of the ramp signal and a first edge of the clock signal, the first edge of the clock signal immediately preceding a state transition time point of the comparative signal. The pulse residue conversion unit is configured to receive the comparative signal and the clock signal, and to output lower bit values corresponding to a second time interval between the first edge of the clock signal and the state transition time point of the comparative signal. The upper bit values and the lower bit values may be output successively.

The pulse residue conversion unit may include a voltage generation circuit and an analog-digital converter. The voltage generation circuit may be configured to output a voltage proportional to a third time interval between the state transition time point of the comparative signal and a second edge of the clock signal, the second edge of the clock signal immediately following the state transition time point. The analog-digital converter may be configured to convert the voltage into digital bits and to output the digital bits as the lower bit values. The analog-digital converter may include one of a flash analog-digital converter (ADC), a successive approximation ADC, an algorithmic ADC, or a pipelined ADC, for example.

The voltage generation circuit may include a pulse generator and a voltage generator. The pulse generator may be configured to output a pulse corresponding to the third time interval. The voltage generator may be configured to output the voltage proportional to a width of the pulse. The pulse generator may be a flip-flop, for example.

The voltage generator may include a current-voltage converter configured to convert a reference current into the voltage in response to the pulse. The voltage generator may include a reference current source configured to generate the reference current, a capacitor, a switch configured to control connection between the reference current source and the capacitor, and a buffer configured to buffer a voltage of the capacitor and to output the buffered voltage as the voltage.

According to an illustrative embodiment, an image sensor includes the two-step analog-digital converting circuit described above, a ramp signal generator configured to generate the ramp signal, and a pixel configured to convert an optical signal into an electric signal and to provide the electric signal to the two-step analog-digital converting circuit as the input signal.

The pulse residue conversion unit of the two-step analog-digital converting circuit may include a pulse generator configured to output a pulse corresponding to a third time interval between the state transition time point and a second edge of the clock signal, the second edge of the clock signal immediately following the state transition time point; a current-voltage converter configured to convert a reference current into a voltage in response to the pulse; and an analog-digital converter configured to convert the voltage into digital bits and to output the digital bits as the lower bit values.

According to an illustrative embodiment, an image processing apparatus includes the image sensor described above, and a processor configured to control the operation of the image sensor.

According to an illustrative embodiment, a two-step analog-digital converting method includes comparing a ramp signal and an input signal with each other and outputting a comparative signal; outputting upper bit values corresponding to a count value of a first time interval between a generation time point of the ramp signal and a first edge of a clock signal, the first edge of the clock signal being immediately previous to a state transition time point of the comparative signal; and outputting lower bit values corresponding to a second time interval between the first edge of the clock signal and the state transition time point of the comparative signal.

Outputting the lower bit values may include generating a voltage proportional to a third time interval between the state transition time point and a second edge of the clock signal, the second edge of the clock signal being immediately after the state transition time point; and converting the voltage into digital bits and outputting the digital bits as the lower bit values. Generating the voltage may include generating a pulse having a pulse width corresponding to the third time interval, and generating the voltage, which changes according to the pulse width. The upper bit values and the lower bit values may be output successively.

According to an illustrative embodiment, an analog-digital converting circuit includes a comparator, an upper bit counter, and a pulse residue conversion unit. The comparator is configured to compare a ramp signal and an input signal, and to output a resulting comparative signal, wherein a state transition time point of the comparative signal does not coincide with an edge of a clock signal. The upper bit counter is configured to receive the comparative signal and to output upper bit values corresponding to a first time interval between a generation time point of the ramp signal and a first edge of the clock signal immediately preceding the state transition time point of the comparative signal. The pulse residue conversion unit is configured to receive the comparative signal and to output lower bit values corresponding to a second time interval between the first edge of the clock signal and the state transition time point of the comparative signal.

BRIEF DESCRIPTION OF THE DRAWINGS

Illustrative embodiments will be more clearly understood from the following detailed description taken in conjunction with the accompanying drawings, in which.

DETAILED DESCRIPTION

Figure 1:
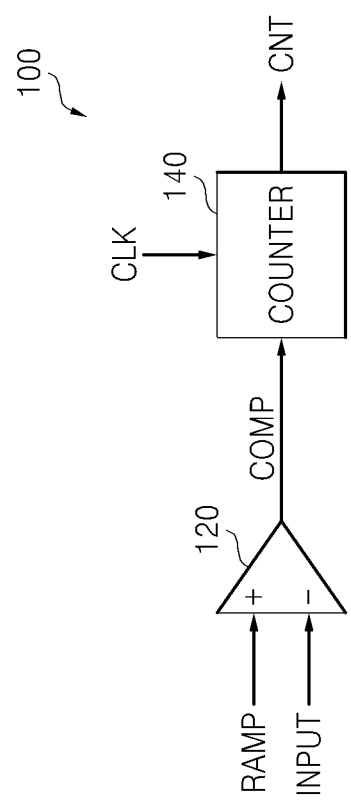
FIG. 1 is a schematic block diagram of a conventional analog-digital converter.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/". Also, the term "exemplary" is intended to refer to an example or illustration.

It will be understood that, although the terms first, second, etc., may be used herein to describe various elements, these elements should not be limited by these terms. These terms are only used to distinguish one element from another. For example, a first signal could be termed a second signal, and similarly, a second signal could be termed a first signal without departing from the present teachings.

The terminology used herein is for the purpose of describing particular embodiments only and is not intended to be limiting of the invention. As used herein, the singular forms "a", "an" and "the" are intended to include the plural forms as well, unless the context indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
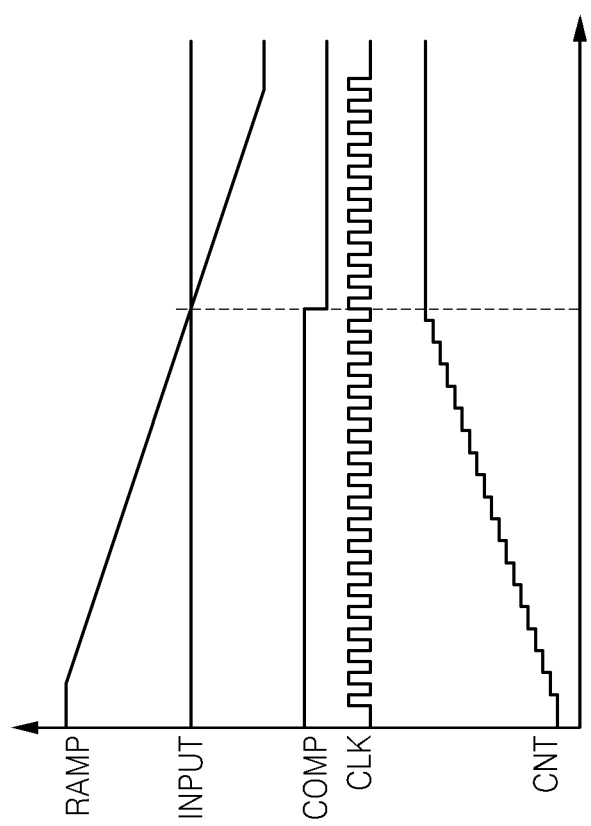
FIG. 2 is a timing diagram for explaining operation of the analog-digital convertor shown in FIG. 1 conceptually.

FIG. 1 is a schematic block diagram of conventional analog-digital converter (ADC), and FIG. 2 is a timing diagram for explaining operation of the analog-digital converter shown in FIG. 1, conceptually.

Referring to FIGS. 1 and 2, conventional analog-digital converter (ADC) 100 includes a comparator 120 and a counter 140. The comparator 120 compares ramp signal RAMP and input signal INPUT with each other, and outputs comparative signal COMP. For example, when a level of the ramp signal RAMP is higher than a level of the input signal INPUT, the comparator 120 outputs the comparative signal COMP having a high level, and when a level of the ramp signal RAMP is lower than a level of the input signal INPUT, the comparator 120 outputs the comparative signal COMP having a low level. The counter 140 outputs a digital value CNT corresponding to a state transition time point of the comparative signal COMP output from the comparator 120 in response to clock signal CLK.

The ADC 100 used in a conventional CMOS image sensor uses the clock signal CLK, which has a high frequency to increase bit resolution. As bit resolutions get higher, and frequencies of clock signals CLK get higher, the ADC 100 must consume more power in order to use the clock signal CLK at the higher frequencies.

Figure 3:
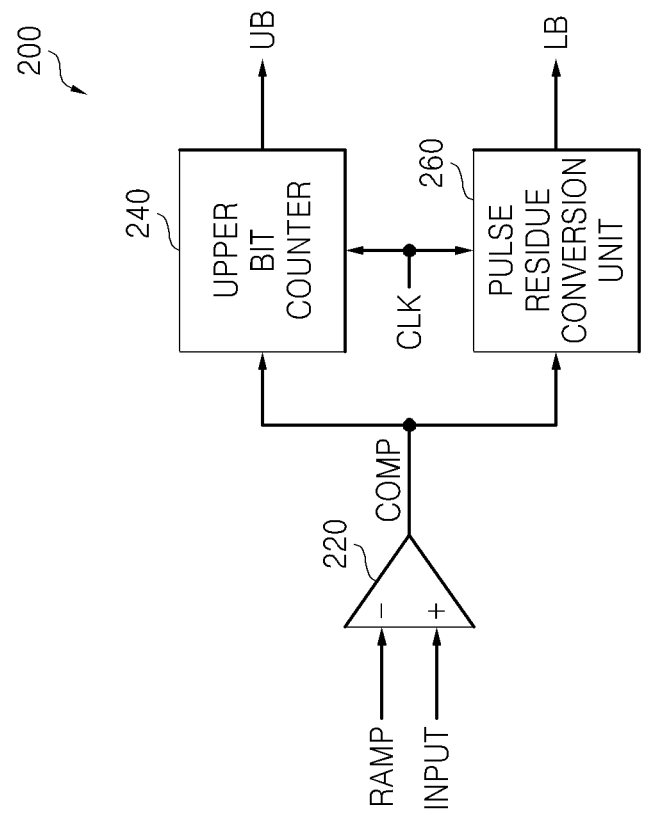
FIG. 3 is a schematic block diagram of a two-step analog-digital converting circuit, according to an exemplary embodiment of the inventive concept.
Figure 7:
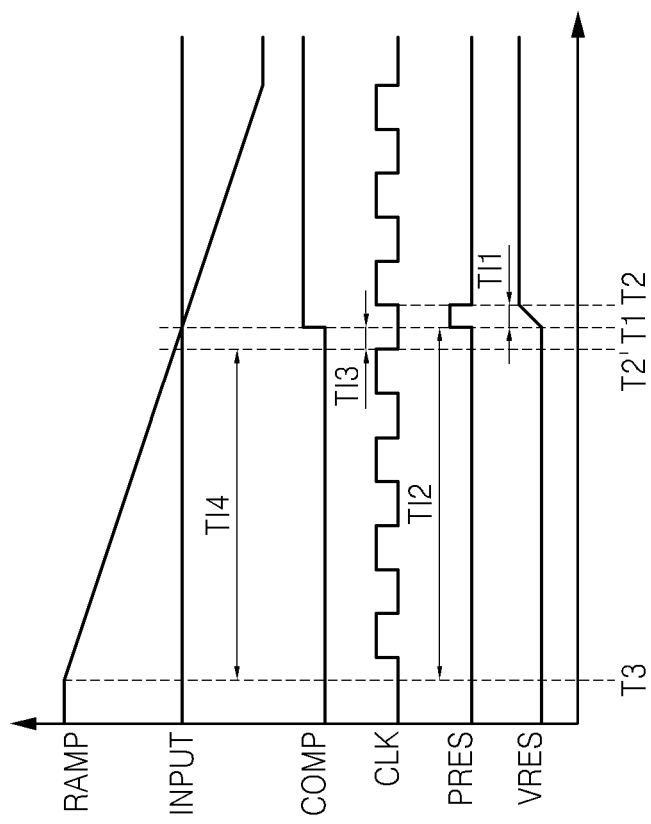
FIG. 7 is a timing diagram for explaining operation of the two-step analog-digital converting circuit shown in FIG. 3, according to an exemplary embodiment of the inventive concept.

FIG. 3 is a schematic block diagram of a two-step analog-digital converting circuit, according to an exemplary embodiment of the inventive concept. FIG. 7 is a timing diagram for explaining operation of the two-step analog-digital converting circuit shown in FIG. 3, according to an exemplary embodiment of the inventive concept.

Referring to FIGS. 3 and 7, two-step analog-digital converting circuit 200 includes a comparator 220, an upper bit counter 240, and a pulse residue conversion unit 260. The comparator 220 compares ramp signal RAMP and input signal INPUT with each other, and outputs comparative signal COMP. The ramp signal RAMP may be provided to a negative input and the input signal INPUT may be provided to a positive input of the comparator 220.

The upper bit counter 240 outputs upper bit values UB corresponding to a time interval TI4 of FIG. 7 between a ramp signal RAMP generation time point T3 and a first edge T2' of clock signal CLK, which is the edge of the clock signal CLK immediately preceding a state transition of the comparative signal COMP output from the comparator 220, at state transition time point T1, in response to the clock signal CLK. For example, the upper bit counter 240 counts the time interval TI4 according to the clock signal CLK, and outputs the count result as upper bit values UB. As indicated, the clock signal CLK may have a lower frequency than a clock signal CLK of a conventional ADC, discussed above.

Figure 4:
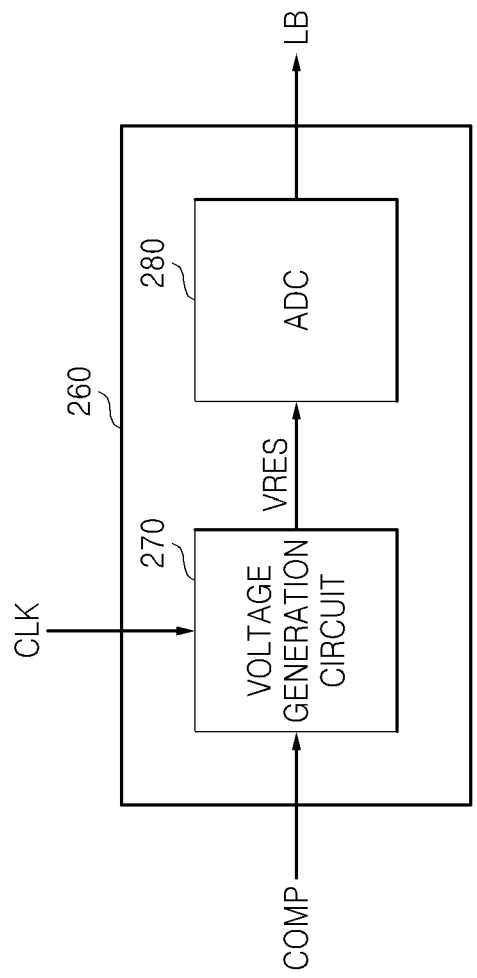
FIG. 4 is a schematic block diagram of a pulse residue converting unit shown in FIG. 3, according to an exemplary embodiment of the inventive concept.

The pulse residue conversion unit 260 outputs lower bit values LB corresponding to a time interval TI3 of FIG. 7 between the first edge T2' of the clock signal CLK and the state transition time point T1 of the comparative signal COMP. More specifically, the pulse residue conversion unit 260 generates voltage VRES (as shown in FIG. 4), which is proportional to a time interval TI1 of FIG. 7. Time interval TI1 is between the state transition time point T1 of the comparative signal COMP and a second edge T2 of the clock signal CLK, which is the edge of the clock signal CLK immediately following the state transition time point T1. The pulse residue conversion unit 260 converts the voltage VRES into a digital value, reverses all the bits included in the digital value into a ones' complement number, and outputs the reversed digital value as lower bit values LB. The state transition time point T1 thus does not need to coincide with an edge of the clock signal CLK.

Accordingly, the two-step analog-digital converting circuit 200 outputs a digital value corresponding to a time interval TI2 of FIG. 7 from the ramp signal RAMP generation time point T3 to the state transition time point T1 of the comparative signal COMP, without using a high frequency clock signal CLK. The two-step analog-digital converting circuit 200 may output upper bit values UB and lower bit values LB successively.

FIG. 4 is a schematic block diagram of the pulse residue conversion unit shown in FIG. 3, according to an exemplary embodiment of the inventive concept.

Referring to FIGS. 3, 4 and 7, the pulse residue conversion unit 260 includes a voltage generation circuit 270 and an analog-digital converter (ADC) 280. The voltage generation circuit 270 outputs voltage VRES proportional to the time interval TI1 from the state transition time point T1 of the comparative signal COMP to the second edge T2 of the clock signal CLK. The analog-digital converter 280 converts the voltage VRES output from the voltage generation circuit 270 into digital bits, and outputs the digital bits as lower bit values LB. The analog-digital converter 280 may be a flash ADC, successive approximation ADC, algorithmic ADC, or pipelined ADC, for example. The analog-digital converter 280 may output lower bit values LB inversely proportional to the voltage VRES output from the voltage generation circuit 270.

According to another exemplary embodiment, the pulse residue conversion unit 260 may further include an inverter (not shown) connected to an output terminal of the analog-digital converter 280. The inverter outputs the reversed bit values as the lower bit values LB.

Accordingly, the pulse residue conversion unit 260 outputs the lower bit values LB corresponding to the time interval TI3 shown in FIG. 7. The time interval TI3 is the time interval between the state transition time point T1 of the comparative signal COMP and the first edge T2' of the clock signal CLK immediately preceding to the state transition time point T1. Thus, the two-step analog-digital converting circuit 200 is able to count the time interval TI2 from the ramp signal RAMP generation time point T3 to the state transition time point T1 of the comparative signal COMP using the clock signal CLK, which has a low frequency, e.g., as compared to a conventional ADC.

Figure 5:
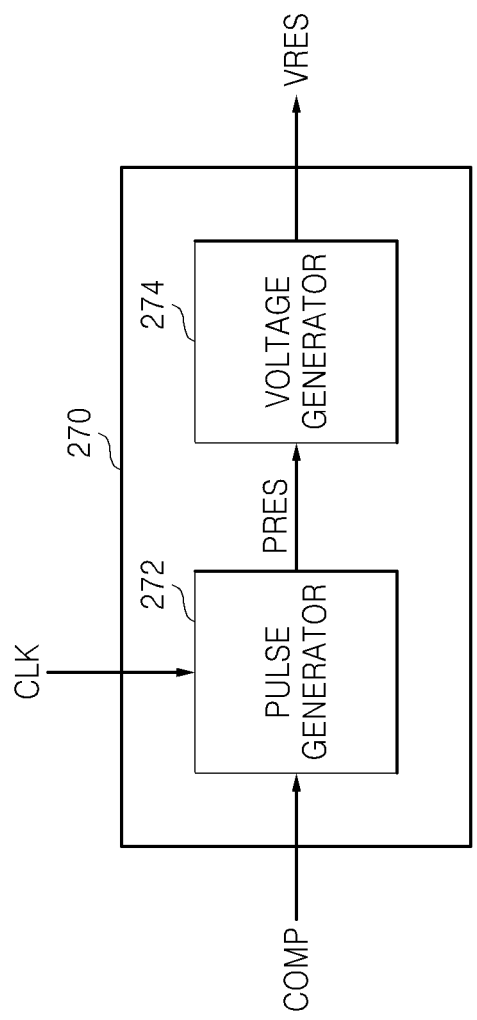
FIG. 5 is a schematic block diagram of a voltage generation circuit shown in FIG. 4, according to an exemplary embodiment of the inventive concept.

FIG. 5 is a schematic block diagram of the voltage generation circuit shown in FIG. 4, according to an exemplary embodiment of the inventive concept.

Referring to FIGS. 3-5 and 7, the voltage generation circuit 270 includes a pulse generator 272 and a voltage generator 274. The pulse generator 272 receives the comparative signal COMP and the clock signal CLK, and outputs a pulse PRES corresponding to the time interval TI1 from the state transition time point T1 of the comparative signal COMP to the second edge T2 of the clock signal CLK. The pulse generator 272 may be a flip-flop, for example. In an embodiment, each of the pulse PRES and the comparative signal COMP is initially low. When the comparative signal COMP transitions from low to high (at the state transition time point T1) while the clock signal CLK is low, the pulse PRES also transitions from low to high. The pulse PRES is maintained high until the clock signal CLK subsequently transitions from low to high (at the second edge T2), resulting in the pulse PRES transitioning from high to low. The pulse PRES is then maintained high while the comparative signal COMP remains high. For example, in terms of a state machine, the pulse PRES is low until the comparative signal COMP transitions high, and then the pulse PRES transitions and remains high until the clock signal CLK next transitions high, and then the pulse PRES transitions and remains low.

The voltage generator 274 outputs voltage VRES corresponding to a width of the pulse PRES output by the pulse generator 272. For example, the voltage VRES may be proportional or inversely proportional to the width of the pulse PRES.

Figure 6:
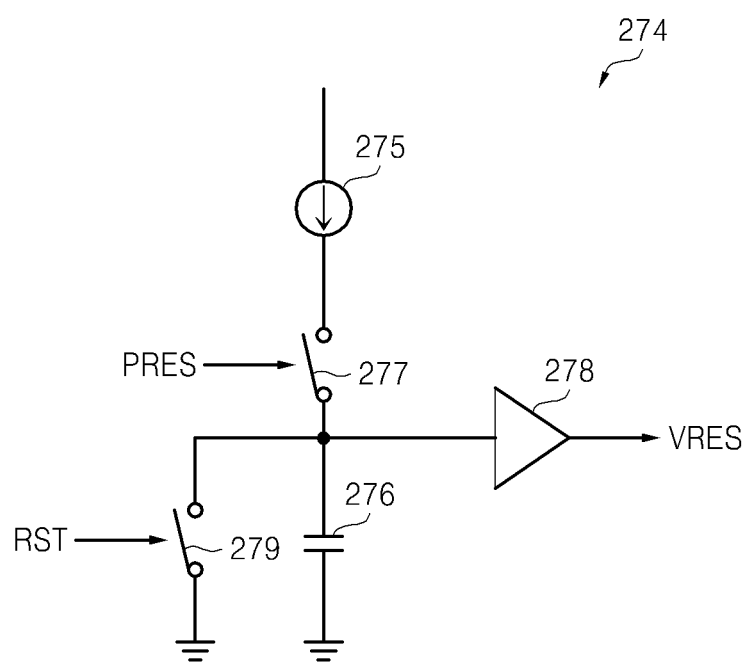
FIG. 6 is a schematic circuit diagram of a voltage generator shown in FIG. 5, according to an exemplary embodiment of the inventive concept.

FIG. 6 is an illustrative schematic circuit diagram of the voltage generator shown in FIG. 5, according to an exemplary embodiment of the inventive concept.

Referring to FIGS. 3-6, the voltage generator 274 may be a current-voltage converter, for example, which includes a reference current source 275, a capacitor 276, a first switch 277, a buffer 278, and a second switch 279. The first switch 277 controls connection between the reference current source 275 and the capacitor 276 in response to the pulse PRES output from the pulse generator 272. When the first switch 277 is an NMOS transistor, for example, the switch 277 connects the reference current source 275 to the capacitor 276 in response to the pulse PRES having a high level and disconnects the reference current source 275 from the capacitor 276 in response to the pulse PRES having a low level. The first switch 277 thus controls transition of an electric charge output from the reference current source 275 to the capacitor 276. The buffer 278 buffers a voltage generated according to the charge charged in the capacitor 276 and outputs the buffered voltage as the voltage VRES. The second switch 279 performs initialization, for example, discharge, of the capacitor 276 according to a reset signal RST.

FIG. 7 is a timing diagram for explaining operation of the two-step analog-digital converting circuit shown in FIG. 3, conceptually, according to an exemplary embodiment of the inventive concept.

Referring to FIGS. 3-7, the comparator 220 of the two-step analog-digital converting circuit 200 compares a level of the ramp signal RAMP and a level of the input signal INPUT with each other, and outputs the comparative signal COMP according to the results of the comparison. The comparative signal COMP is received by the upper bit counter 240 and the pulse residue conversion unit 260, which includes the voltage generation circuit 270 and the analog-digital converter 280. The pulse generator 272 of the voltage generation circuit 270 generates pulse PRES, which has a pulse width corresponding to the time interval TI1 of FIG. 7. As shown, during the time interval TI1, the voltage VRES output from the voltage generator 274 of the voltage generation circuit 270 increases according to charges charged in the capacitor 276. The voltage VRES may be proportional or inversely proportional to the pulse width of the pulse PRES.

The upper bit counter 240 counts the time interval TI4 from the ramp signal RAMP generation time point T3 to the first edge T2' of the clock signal CLK, and outputs upper bit values UB. The pulse residue conversion unit 260 reverses digital bits proportional to the voltage VRES in bit-wise, and outputs the reversed digital bits as lower bit values LB.

Figure 8:
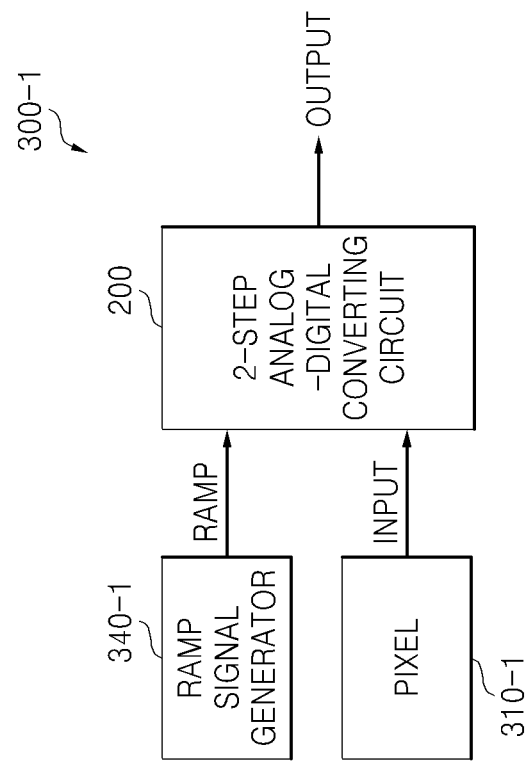
FIG. 8 is a block diagram illustrating an image sensor including the two-step analog-digital converting circuit shown in FIG. 3, according to an exemplary embodiment of the inventive concept.

FIG. 8 is a block diagram illustrating an image sensor including the two-step analog-digital converting circuit shown in FIG. 3, according to an exemplary embodiment of the inventive concept.

Referring to FIG. 8, image sensor 300-1 includes two-step analog-digital converting circuit 200, a ramp signal generator 340-1, and a pixel 310-1. The ramp signal generator 340 generates and outputs the ramp signal RAMP into the two-step analog-digital converting circuit 200. The pixel 310-1 converts an optical signal into an electric signal, and outputs the electric signal to the two-step analog-digital converting circuit 200 as the input signal INPUT. The two-step analog-digital converting circuit 200 outputs an output signal OUTPUT, including upper bit values UB and lower bit values LB, using the ramp signal RAMP and the input signal INPUT, as discussed above.

Figure 9:
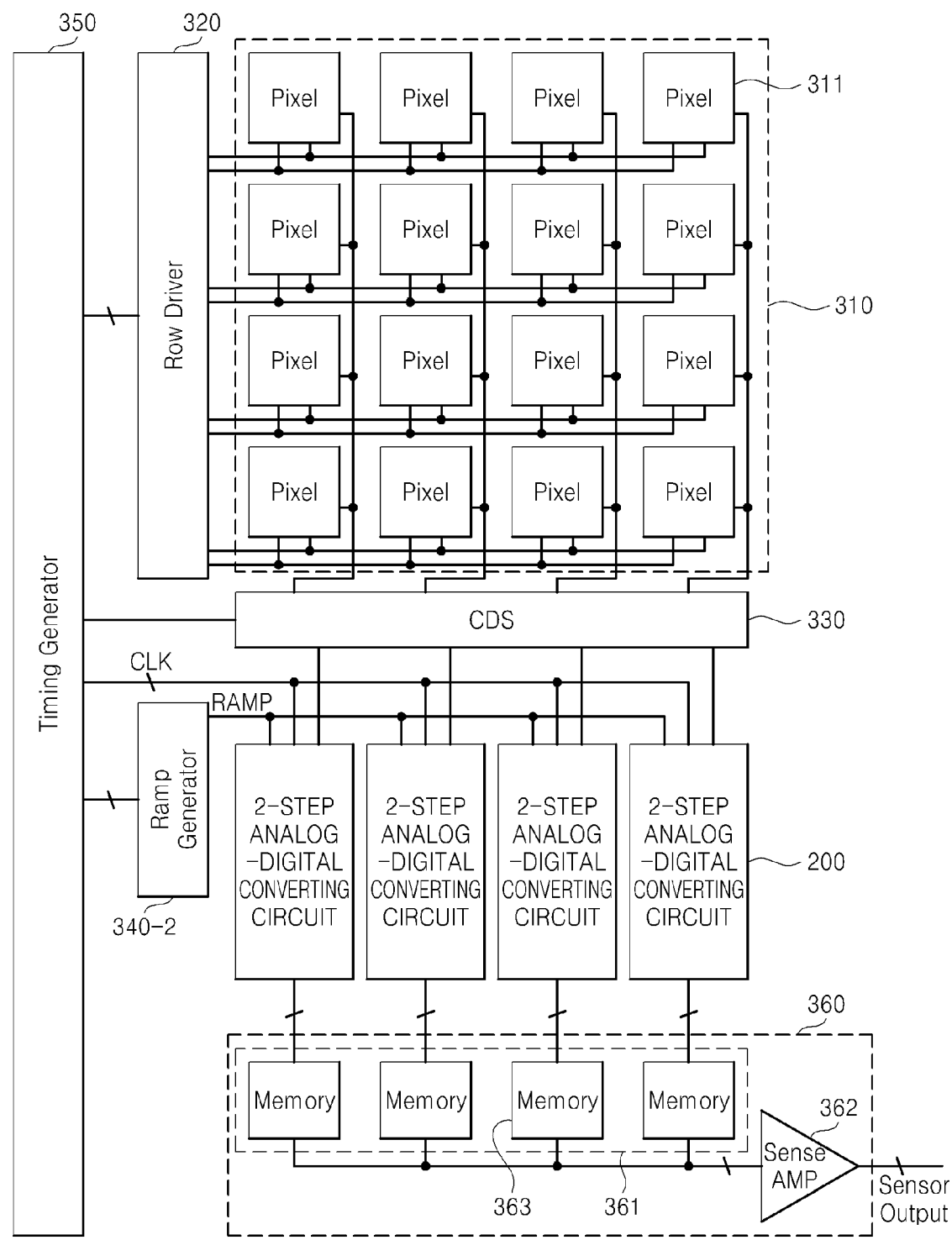
FIG. 9 is a block diagram illustrating an image sensor including the two-step analog-digital converting circuit shown in FIG. 3, according to another exemplary embodiment of the inventive concept.

FIG. 9 is a block diagram illustrating an image sensor including the two-step analog-digital converting circuit shown in FIG. 3, according to another exemplary embodiment of the inventive concept.

Referring to FIG. 9, image sensor 300-2 includes an active pixel array 310, a row driver 320, a correlated double sampling (CDS) block 330, multiple two-step analog-digital converting circuits 200, a ramp signal generator 340-2, a timing generator 350, and an output buffer 360. The active pixel array 310 includes multiple pixels 311 in matrix form, and each pixel 311 is connected between corresponding row lines and column lines. The pixel array 310 converts an optical image signal into electric pixel signals using the multiple pixels 311. Each pixel 311 may be a red pixel for converting light in the red spectrum region into an electric signal, a green pixel for converting light in the green spectrum region into an electric signal, or a blue pixel for converting light in the blue spectrum region into an electric signal. In some embodiments, each pixel 311 may be a photo diode or a pinned photo diode, for example.

The row driver 320 drives the active pixel array 310 in row units. The row driver 320 decodes row control signals, such as row address signals, for example, output from the timing generator 350 and drives at least one row line among the multiple row lines included in the active pixel array 310 according to the decoding results. The CDS block 330 may execute CDS with respect to pixel signals output from unit pixels connected to the multiple column lines included in the active pixel array 310. The ramp signal generator 340-2 generates ramp signal RAMP in response to a control signal output from the timing generator 350. The ramp signal RAMP may be ramping-up or ramping-down. The timing generator 350 outputs control signals to control each of the row driver 320, the CDS 330, the two-step analog-digital converting circuits 200, and the ramp signal generator 340-2.

The output buffer 360 outputs digital signals output from the two-step analog-digital converting circuits 200. The output buffer 360 includes a column memory block 361 and a sense amplifier 362, and the column memory block 361 includes multiple memories 363. Each memory 363 stores an output signal from an analog-digital converting circuit 200, according to the control signal output from the timing generator 350. The sense amplifier 362 senses and amplifies the signal output from the each memory 362.

Figure 10:
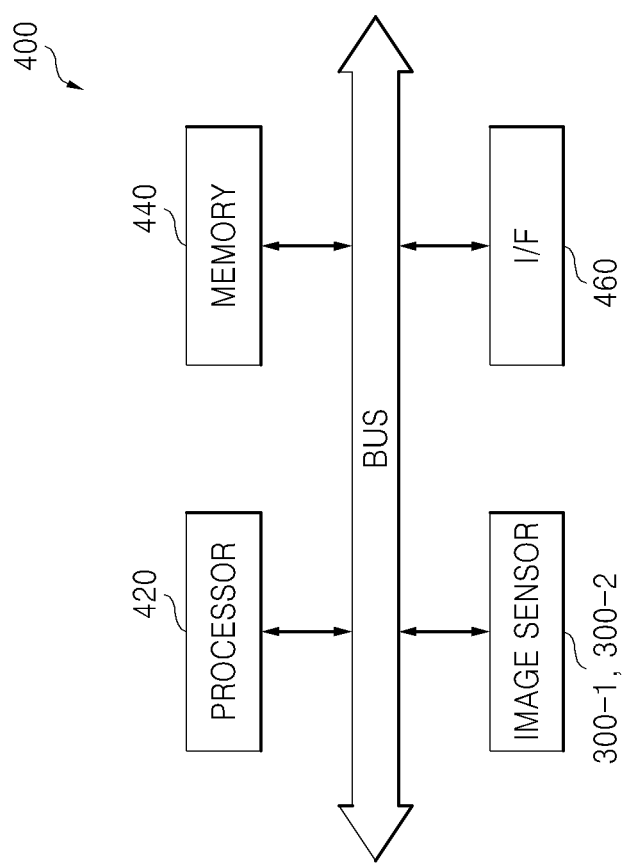
FIG. 10 is a block diagram illustrating an image processing apparatus including the image sensor shown in FIG. 8 or 9, according to an exemplary embodiment of the inventive concept.

FIG. 10 is a block diagram illustrating an image processing apparatus, including the image sensor shown in FIG. 8 or 9, according to an exemplary embodiment of the inventive concept.

Referring to FIG. 10, image processing apparatus 400 includes the image sensor 300-1 or 300-2 and a processor 420 for controlling operations of the image sensor 300-1 or 300-2. The image processing apparatus 400 also may include memory 440 capable of storing signals processed by the image sensor 300-1 or 300-2. The memory 440 may be a non-volatile memory device, for example, although other types of memory may be incorporated without departing from the scope of the present teachings. The image processing apparatus 400 may further include an interface (I/F) 460. The interface 460 may include a display and/or an input device, such as key board, mouse, or touch pad, for example. The image data generated by the image sensor 300-1 or 300-2 may be stored in the memory 440 and/or displayed through a display under the control of the processor 420.

The image processing apparatus 400 may be embodied within a digital camera, a portable device mounting a digital camera, or an electronic device equipped with a digital camera, for example. The image processing apparatus 400 may process a two-dimensional image data or a three-dimensional image data.

Figure 11:
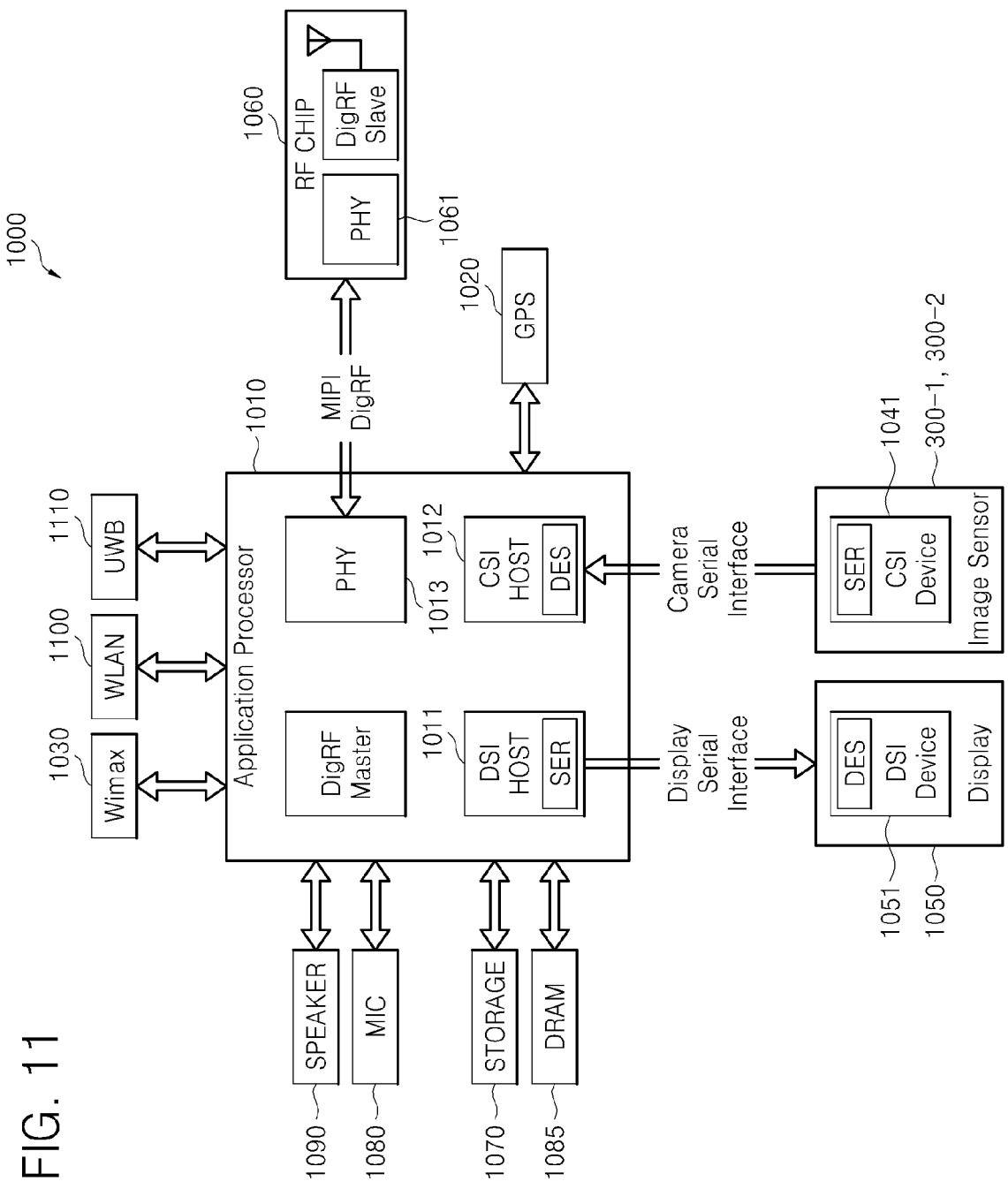
FIG. 11 is a block diagram illustrating an image processing apparatus including the image sensor shown in FIG. 8 or 9, according to another exemplary embodiment of the inventive concept.

FIG. 11 is a block diagram illustrating an image processing apparatus, including the image sensor shown in FIG. 8 or 9, according to another exemplary embodiment of the inventive concept.

Referring to FIG. 11, the image processing apparatus 1000 may be a portable device able to use or supply a mobile industry processor interface (MIPI), for example, such as a mobile phone, a smart phone, a tablet PC, and the like. The image processing apparatus 1000 includes an application processor 1010, an image sensor 300-1 or 300-2, and a display 1050.

In the depicted embodiment, the application processor 1010 includes CSI host 1012 and DSI host 1011. The CSI host 1012 is configured to conduct serial communications with a CSI device 1041 of the image sensor 300-1 or 300-2 through a camera serial interface (CSI). The DSI host 1011 is configured to conduct serial communications with a DSI device 1051 of the display 1050 through a display serial interface (DSI).

The image processing apparatus 1000 may further include an RF chip 1060, which is able to communicate with the application processor 1010. A PHY 1013 of the image processing apparatus 1000 and a PHY 1061 of the RF chip 1060 may exchange data according to MIPI DigRF, for example. The image processing apparatus 1000 may further include GPS 1020, storage 1070, a mike 1080, DRAM 1085 and a speaker 1090, as well as capabilities to communicate using Wimax 1030, WLAN 1100, and/or UWB 1110.

Figure 12:
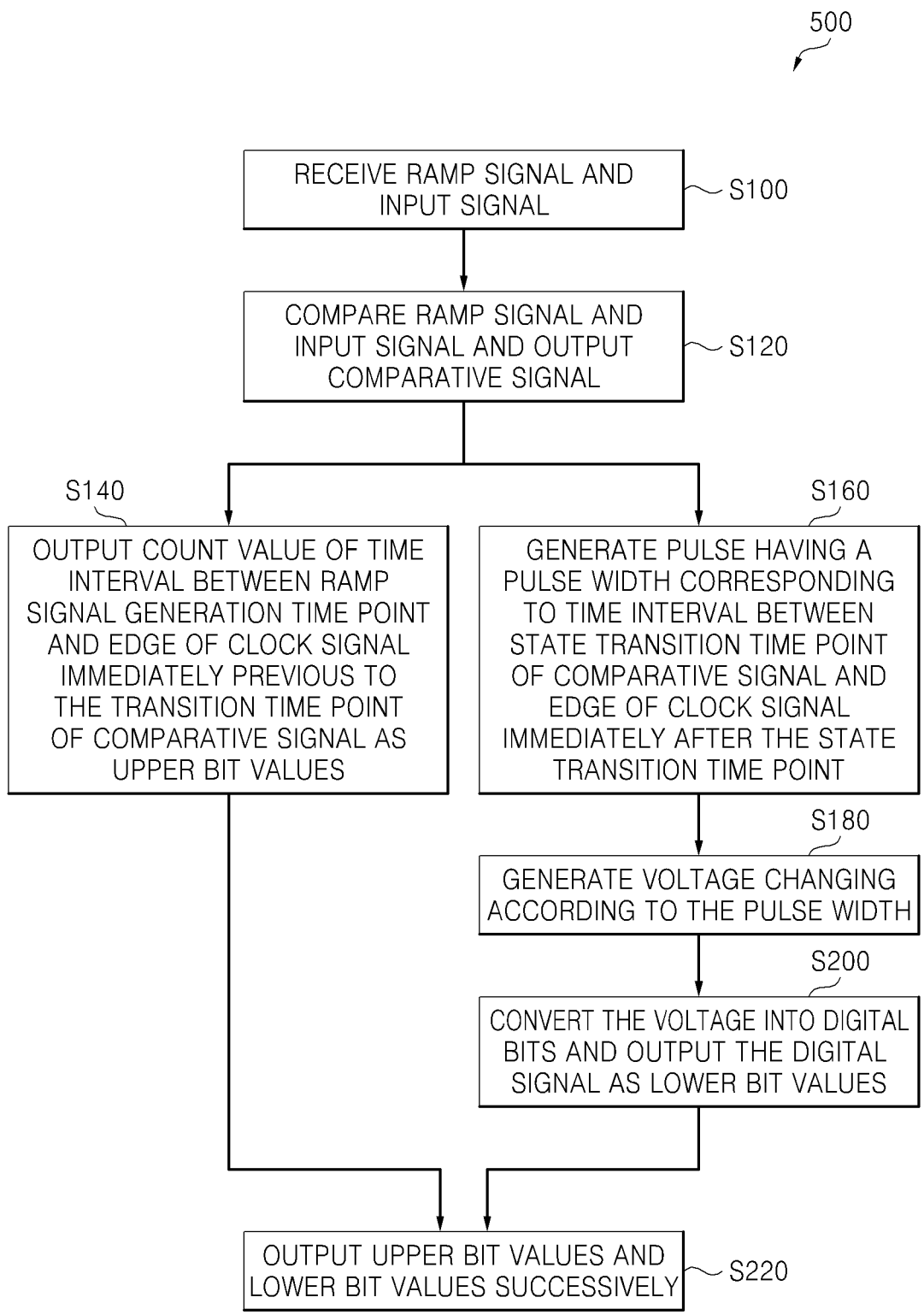
FIG. 12 is a flow chart illustrating a two-step analog-digital converting method, according to an exemplary embodiment of the inventive concept.

FIG. 12 is a flow chart illustrating a two-step analog-digital converting method, according to an exemplary embodiment of the inventive concept.

Referring to FIGS. 3-7 and 12, the two-step analog-digital converting circuit 200 receives ramp signal RAMP and input signal INPUT (S100), compares the ramp signal RAMP and the input signal INPUT with each other, and generates comparative signal COMP according to the result of comparison (S120). The two-step analog-digital converting circuit 200 counts the time interval TI4 from the ramp signal RAMP generation time point T3 to the first edge T2' of the clock signal CLK, and outputs the count result as upper bit values UB (S140). As discussed above, the first edge T2' is the edge of the clock signal CLK immediately previous to the state transition time point T1 of the comparative signal COMP, which is a falling edge in the example depicted in FIG. 7.

The two-step analog-digital converting circuit 200 also generates pulse PRES, which has a pulse width corresponding to the time interval TI1 from the state transition time point T1 of the comparative signal COMP to the second edge T2 of the clock signal CLK (S160). As discussed above, the second edge T2 is the edge of the clock signal CLK immediately after the state transition time point T1, which is a rising edge in the example depicted in FIG. 7. The two-step analog-digital converting circuit 200 generates voltage VRES, which changes according to the pulse PRES width (S180). The two-step analog-digital converting circuit 200 converts the voltage VRES into digital bits and outputs the converted digital bits as lower bit values LB (S200). The upper bit values UB and the lower bit values LB may be output as an output signal OUTPUT successively (S220).

The two-step analog-digital converting circuit and the two-step analog-digital converting method according to exemplary embodiments of the inventive concept have the effect of enabling fast processing and reducing power consumption in a high bit resolution.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A two-step analog-digital converting circuit comprising:
a comparator configured to compare a ramp signal and an input signal, and to output a resulting comparative signal;
an upper bit counter configured to receive the comparative signal and a clock signal, and to output upper bit values corresponding to a first time interval between a generation time point of the ramp signal and a first edge of the clock signal, the first edge of the clock signal immediately preceding a state transition time point of the comparative signal; and
a pulse residue conversion unit configured to receive the comparative signal and the clock signal, and to output lower bit values corresponding to a second time interval between the first edge of the clock signal and the state transition time point of the comparative signal.

2. The two-step analog-digital converting circuit of claim 1, wherein the pulse residue conversion unit comprises:
a voltage generation circuit configured to output a voltage proportional to a third time interval between the state transition time point of the comparative signal and a second edge of the clock signal, the second edge of the clock signal immediately following the state transition time point; and
an analog-digital converter configured to convert the voltage into digital bits and to output the digital bits as the lower bit values.

3. The two-step analog-digital converting circuit of claim 2, wherein the analog-digital converter comprises one of a flash analog-digital converter (ADC), a successive approximation ADC, an algorithmic ADC, or a pipelined ADC.

4. The two-step analog-digital converting circuit of claim 2, wherein the voltage generation circuit comprises:
a pulse generator configured to output a pulse corresponding to the third time interval; and
a voltage generator configured to output the voltage proportional to a width of the pulse.

5. The two-step analog-digital converting circuit of claim 4, wherein the pulse generator comprises a flip-flop.

6. The two-step analog-digital converting circuit of claim 4, wherein the voltage generator comprises a current-voltage converter configured to convert a reference current into the voltage in response to the pulse.

7. The two-step analog-digital converting circuit of claim 6, wherein the voltage generator comprises:
a reference current source configured to generate the reference current;
a capacitor;
a switch configured to control connection between the reference current source and the capacitor; and
a buffer configured to buffer a voltage of the capacitor and to output the buffered voltage as the voltage.

8. The two-step analog-digital converting circuit of claim 1, wherein the upper bit values and the lower bit values are output successively.

9. An image sensor comprising:
the two-step analog-digital converting circuit of claim 1;
a ramp signal generator configured to generate the ramp signal; and
a pixel configured to convert an optical signal into an electric signal and to provide the electric signal to the two-step analog-digital converting circuit as the input signal.

10. The image sensor of claim 9, wherein the pulse residue conversion unit comprises:
a pulse generator configured to output a pulse corresponding to a third time interval between the state transition time point and a second edge of the clock signal, the second edge of the clock signal immediately following the state transition time point
a current-voltage converter configured to convert a reference current into a voltage in response to the pulse; and
an analog-digital converter configured to convert the voltage into digital bits and to output the digital bits as the lower bit values.

11. An image processing apparatus comprising:
the image sensor of claim 9; and
a processor configured to control the operation of the image sensor.

12. A two-step analog-digital converting method, comprising:
comparing a ramp signal and an input signal with each other and outputting a comparative signal;
outputting upper bit values corresponding to a count value of a first time interval between a generation time point of the ramp signal and a first edge of a clock signal, the first edge of the clock signal being immediately previous to a state transition time point of the comparative signal; and outputting lower bit values corresponding to a second time interval between the first edge of the clock signal and the state transition time point of the comparative signal.

13. The method of claim 12, wherein outputting the lower bit values comprises:

generating a voltage proportional to a third time interval between the state transition time point and a second edge of the clock signal, the second edge of the clock signal being immediately after the state transition time point; and converting the voltage into digital bits and outputting the digital bits as the lower bit values.

14. The method of claim 13, wherein generating the voltage comprises:

generating a pulse having a pulse width corresponding to the third time interval; and generating the voltage changing according to the pulse width.

15. The method of claim 12, wherein the upper bit values and the lower bit values are output successively.

16. An analog-digital converting circuit comprising:

a comparator configured to compare a ramp signal and an input signal, and to output a resulting comparative signal;

an upper bit counter configured to receive the comparative signal and to output upper bit values corresponding to a first time interval between a generation time point of the ramp signal and a first edge of the clock signal immediately preceding a state transition time point of the comparative signal, wherein the state transition time point of the comparative signal does not coincide with an edge of a clock signal; and a pulse residue conversion unit configured to receive the comparative signal and to output lower bit values corresponding to a second time interval between the first edge of the clock signal and the state transition time point of the comparative signal.

17. The analog-digital converting circuit of claim 16, wherein the pulse residue conversion unit comprises:

a voltage generation circuit configured to output a voltage proportional to a third time interval between the state transition time point of the comparative signal and a second edge of the clock signal immediately following the state transition time point; and an analog-digital converter configured to convert the voltage into the lower bit values.

18. The analog-digital converting circuit of claim 2, wherein the voltage generation circuit comprises:

a pulse generator configured to output a pulse having pulse width corresponding to the third time interval; and a voltage generator configured to output the voltage proportional to the pulse width.

19. The analog-digital converting circuit of claim 18, wherein the pulse generator comprises a flip-flop.

20. The analog-digital converting circuit of claim 19, wherein the voltage generator comprises:

a reference current source configured to generate the reference current;

a capacitor; and a switch configured to connect the reference current source to the capacitor in response to the pulse having a high level and to disconnect the reference current source from the capacitor in response to the pulse having a low level, wherein a voltage of the capacitor corresponds to the voltage output by the voltage generator.

* * * * *